(12) United States Patent
Kim

(10) Patent No.: US 11,538,382 B2
(45) Date of Patent: Dec. 27, 2022

(54) DRIVING INTEGRATED CIRCUIT FOR DISPLAY

(71) Applicant: Silicon Works Co., Ltd., Daejeon (KR)

(72) Inventor: Hee Joo Kim, Daejeon (KR)

(73) Assignee: Silicon Works Co., Ltd, Daejeon (KR)

( * ) Notice: Subject to any disclaimer, the term of this patent is extended or adjusted under 35 U.S.C. 154(b) by 0 days.

(21) Appl. No.: 17/223,961

(22) Filed: Apr. 6, 2021

(65) Prior Publication Data

US 2021/0319738 A1  Oct. 14, 2021

(30) Foreign Application Priority Data

Apr. 8, 2020 (KR) .......... 10-2020-0042698

(51) Int. Cl.
*G09G 3/20* (2006.01)
*H01L 23/522* (2006.01)

(52) U.S. Cl.
CPC .......... *G09G 3/20* (2013.01); *H01L 23/5223* (2013.01); *G09G 2300/0426* (2013.01); *G09G 2330/04* (2013.01)

(58) Field of Classification Search
CPC ........ G09G 2300/0426; G09G 2330/04; H01L 23/5223
See application file for complete search history.

(56) References Cited

U.S. PATENT DOCUMENTS

2021/0134917 A1* 5/2021 Li .................. G09G 3/3266

FOREIGN PATENT DOCUMENTS

KR    10-1557840 B1    10/2015

* cited by examiner

*Primary Examiner* — Gene W Lee
(74) *Attorney, Agent, or Firm* — Polsinelli PC

(57) ABSTRACT

The present disclosure discloses a driving integrated circuit for a display which is configured using MIM capacitors. The driving integrated circuit includes a first circuit formed in a substrate corresponding to a first region of a chip, a second circuit formed in the substrate corresponding to a second region of the chip, a first MIM capacitor formed in a first layer over the substrate and having a first capacity for the first circuit, and a second MIM capacitor formed in a second layer over the substrate and having a second capacity for the second circuit.

14 Claims, 2 Drawing Sheets

DRIVING INTEGRATED CIRCUIT FOR DISPLAY

BACKGROUND

1. Technical Field

The present disclosure relates to a driving integrated circuit for a display, and more particularly, to a driving integrated circuit for a display, which is configured using a metal-insulator-metal (hereinafter referred to as an "MIM") capacitor.

2. Related Art

A display includes a driving integrated circuit which changes display data into a source signal and provides the source signal to a display panel.

The driving integrated circuit has a configuration driven to restore the display data provided by a timing controller, change the restored display data into the source signal corresponding to gradation, and provide the source signal to the display panel.

To this end, the driving integrated circuit includes a data processing circuit for changing the display data into the source signal, a channel circuit for outputting the source signal to the display panel, an electrostatic discharge (ESD) circuit for protecting an internal circuit against ESD, etc.

The driving integrated circuit may be configured to use a full-scale driving voltage, a half driving voltage, that is, an intermediate voltage of the driving voltage, etc. For example, the data processing circuit may be configured to use a half driving voltage in order to reduce power consumption. The channel circuit may be configured to use a full-scale driving voltage for the output of the source signal.

The data processing circuit, channel circuit and ESD circuit of the driving integrated circuit require capacitors for a purpose, such as the stabilization of a driven signal.

In the driving integrated circuit, the data processing circuit, the channel circuit, and the ESD circuit are implemented in a semiconductor substrate. Multi-layered metal layers for the transfer of a signal, the supply of power, etc. are formed on the substrate.

In general, if the capacitor is formed in the substrate, the capacitor requires an area having a larger size than that of other elements, such as a transistor.

Therefore, if the data processing circuit and the channel circuit are formed in the substrate and configured to include the capacitors, the capacitors occupy an area having a large size within a chip area.

Accordingly, it is necessary to design the driving integrated circuit so that the capacitors necessary for the data processing circuit and the channel circuit can be configured without occupying a large area.

SUMMARY

Various embodiments are directed to providing a driving integrated circuit for a display, which can reduce an area burden attributable to a capacitor.

Also, various embodiments are directed to providing a driving integrated circuit for a display, in which capacitors for a data processing circuit and a channel circuit are configured using the same kind of MIM capacitors and which can limit an increase in the chip size attributable to the capacitor.

Also, various embodiments are directed to providing a driving integrated circuit for a display, which can have a reduced chip size by forming MIM capacitors in accordance with the data processing circuit and the channel circuit and forming the MIM capacitor in a metal layer in a region of the substrate in each of the data processing circuit and channel circuit.

In an embodiment, a driving integrated circuit for a display includes a first circuit formed in a first region of a substrate on a chip, a second circuit formed in a second region of the substrate on the chip, a first MIM capacitor formed in a first layer over the substrate and having a first capacity for the first circuit, and a second MIM capacitor formed in a second layer over the substrate and having a second capacity for the second circuit, wherein the first capacity is formed to be greater than the second capacity.

In an embodiment, a driving integrated circuit for a display includes a channel circuit formed in a substrate corresponding to a first region of a chip and configured to drive a first signal with a first voltage scale, a data processing circuit formed in the substrate corresponding to a second region of the chip and configured to drive a second signal with a second voltage scale, a first MIM capacitor formed in a first layer over the substrate within the first region and having a first capacity for the channel circuit, and a second MIM capacitor formed in a second layer over the substrate within the second region and having a second capacity for the data processing circuit, wherein the second voltage scale is smaller than the first voltage scale, and the first capacity is formed to be greater than the second capacity.

In the driving integrated circuit for a display according to an embodiment of the present disclosure, the capacitors are formed in an overlapped part of regions within the data processing circuit and channel circuit of the substrate. The capacitors are configured using the same kind of MIM capacitors.

Therefore, the driving integrated circuit for a display according to the present disclosure has an advantage in that the driving integrated circuit is configured to have a small area burden attributable to the capacitor.

Furthermore, the driving integrated circuit for a display according to the present disclosure uses the MIM capacitor capable of implementing a high capacity with a smaller area than a capacitor using a MOS transistor. The MIM capacitor for a connection with a circuit, corresponding to an upper part of a region in which the data processing circuit or the channel circuit is formed, is formed.

Therefore, the driving integrated circuit for a display according to the present disclosure has an advantage in that it can limit an increase in the chip size attributable to the capacitor and have a reduced chip size.

DETAILED DESCRIPTION

Figure 1:
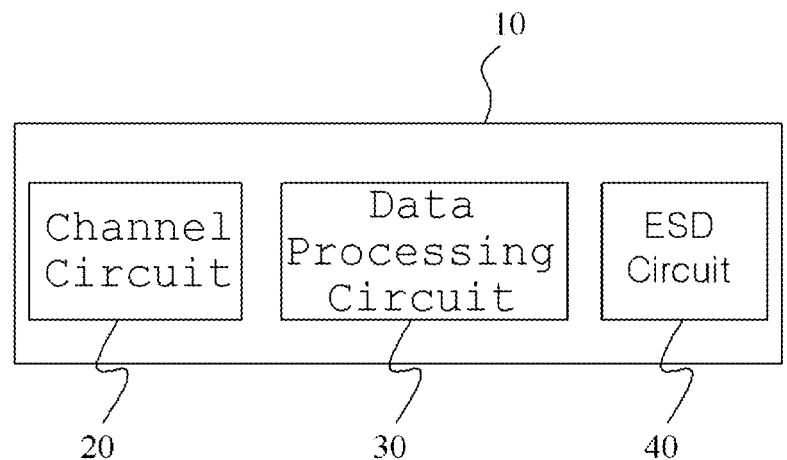
FIG. 1 is a deployment diagram illustrating a preferred embodiment of a driving integrated circuit for a display according to the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

A display includes a driving integrated circuit 10 of FIG. 1 which changes display data into a source signal and provides the source signal to a display panel.

The driving integrated circuit 10 may include various parts, such as a part for restoring display data provided by an external timing controller (not illustrated), a part for changing the restored display data into the source signal corresponding to gradation, and a part driven to provide the source signal to the display panel. Furthermore, the parts may be formed in a semiconductor substrate (hereinafter referred to as a "substrate") by a semiconductor process.

FIG. 1 illustrates that the driving integrated circuit 10 includes a channel circuit 20, a data processing circuit 30, and an electrostatic discharge (ESD) circuit 40.

In this case, the channel circuit 20 corresponds to a part configured to provide a source signal to a display panel. The data processing circuit 30 corresponds to a part configured to change display data into the source signal corresponding to gradation. The ESD circuit 40 blocks static electricity so that the channel circuit 20 or the data processing circuit 30 is not influenced by ESD.

Figure 2:
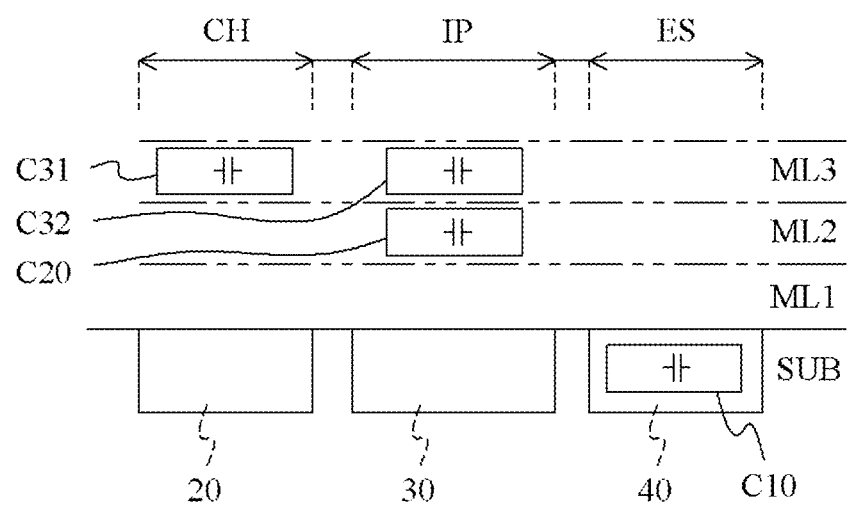
FIG. 2 is a cross-sectional view illustrating that MIM capacitors are configured in the driving integrated circuit of FIG. 1.

The channel circuit 20, the data processing circuit 30, and the ESD circuit 40 may be distributed and formed in divided regions of a substrate SUB as illustrated in FIG. 2, and each may be configured to include elements, such as a transistor, a resistor, a diode, a BJT, and a capacitor.

More specifically, the channel circuit 20 may be understood as a first circuit, which is formed in a first region CH of the substrate SUB on a chip and drives a first signal with a first voltage scale having a maximum value set to become a driving voltage having a preset level.

Furthermore, the data processing circuit 30 may be understood as a second circuit, which is formed in a second region IP of the substrate SUB on the chip and drives a second signal with a second voltage scale set to use a half driving voltage, that is, an intermediate voltage of the driving voltage and a ground voltage.

Therefore, it may be understood that the first voltage scale is greater than the second voltage scale and the half driving voltage has a level corresponding to a ½*driving voltage.

Furthermore, the ESD circuit 40 may be understood as a third circuit formed in the substrate SUB corresponding to a third region ES of the chip.

As described above, the first region CH, the second region IP, and the third region ES are different regions planarly separated in the substrate SUB as illustrated in FIGS. 1 and 2. The regions may be formed to be insulated from each other.

The ESD circuit 40 of the third region ES among the regions includes a capacitor C10 therein. The capacitor C10 may be configured as a MOS capacitor.

Furthermore, a plurality of layers for the transfer of a signal, the supply of power, etc. may be formed on the substrate SUB configured as described above. The plurality of layers may include multi-layered metal layers.

More specifically, a plurality of layers ML1, ML2, and ML3 may be formed on the substrate SUB as described above. For a description of an embodiment, the plurality of layers ML1, ML2, and ML3 is written as a metal layer ML1, a metal layer ML2, and a metal layer ML3.

The metal layer ML1, the metal layer ML2, and the metal layer ML3 are sequentially staked on the substrate SUB. In general, the metal layers ML1, ML2, and ML3 are formed to be isolated from one another by an interlayer dielectric layer (not illustrated).

Each of the metal layers ML1, ML2, and ML3 is formed to have a specific plane pattern for forming a metal line for the transfer of a signal or the supply of power. A contact/via (not illustrated) formed to penetrate the interlayer dielectric layer may be formed at a specific location of each of the metal layers. Each of the metal layers ML1, ML2, and ML3 may transmit a signal or supply power to an underlying element corresponding to one of the channel circuit 20, the data processing circuit 30, and the ESD circuit 40 through the contact/via.

An embodiment of the present disclosure is configured to form MIM capacitors in the metal layer ML2 and the metal layer ML3 among the metal layers ML1, ML2, and ML3.

The metal layer ML1 is formed close to the substrate SUB. Therefore, if the MIM capacitor is formed in the metal layer ML1, the MIM capacitor may affect an operation of an element formed in the substrate SUB. Therefore, it is preferred that the MIM capacitor according to the present disclosure is formed at a location isolated from the substrate SUB with at least one metal layer interposed therebetween.

The driving integrated circuit 10 configured according to an embodiment of the present disclosure includes the MIM capacitor capable of implementing a high capacity with a smaller area than a capacitor using a MOS transistor.

The MIM capacitor is configured to correspond to each of the channel circuit 20 and the data processing circuit 30. The MIM capacitor corresponding to the channel circuit 20 may be generally called a first MIM capacitor. The MIM capacitor corresponding to the data processing circuit 30 may be generally called a second MIM capacitor.

Referring to FIG. 2, an MIM capacitor C31 as the first MIM capacitor has a first capacity for the channel circuit 20, and is formed in a first layer over the substrate SUB, that is, within the first region CH of the metal layer ML3. Furthermore, MIM capacitors C20 and C32 as the second MIM capacitor have a second capacity for the data processing circuit 30, and are formed within the second region IP of a second layer over the substrate SUB. In this case, FIG. 2 illustrates that the second layer includes the metal layer ML2 and the metal layer ML3, that is, unit layers.

The channel circuit 20 drives the first signal with the first voltage scale having a maximum value set to become a driving voltage having a preset level. The data processing circuit 30 drives the second signal with the second voltage scale set to use a half driving voltage, that is, an intermediate voltage of the driving voltage and a ground voltage.

Specifically, it may be understood that the first voltage scale is between the ground voltage and the driving voltage. Furthermore, it may be understood that the second voltage scale is between the ground voltage and the half driving voltage or between the half driving voltage and the driving voltage.

For example, the data processing circuit 30 drives a signal between the half driving voltage and the driving voltage in accordance with display data having a positive polarity, and drives the second signal between the ground voltage and the half driving voltage in accordance with display data having a negative polarity. Accordingly, the data processing circuit 30 limits a maximum value of a voltage scale of the second signal to a level of the half driving voltage. As a result, power used to drive the second signal can be reduced.

Furthermore, the channel circuit 20 receives a signal of the data processing circuit 30, which is driven between the ground voltage and the half driving voltage or between the half driving voltage and the driving voltage, and drives and outputs a source signal between the ground voltage and the driving voltage. That is, the channel circuit 20 drives the first signal with the first voltage scale having a maximum value set to become the driving voltage.

Therefore, the MIM capacitor C31 configured to correspond to the channel circuit 20, as the first MIM capacitor, needs to be designed to have the first capacity by considering the first voltage scale of the first signal. The MIM capacitors C20 and C32 configured to correspond to the data processing circuit 30, as the second MIM capacitor, need to be designed to have the second capacity by considering the second voltage scale of the second signal. In this case, it is may be understood the second capacity is a capacity formed by a combination of the two MIM capacitors C20 and C32, that is, a capacity of the second MIM capacitor.

Therefore, the first capacity of the first MIM capacitor needs to be set greater than the second capacity of the second MIM capacitor.

In the present disclosure, each of the first MIM capacitor and the second MIM capacitor may be formed in one metal layer or a plurality of metal layers. If the first MIM capacitor and the second MIM capacitor are formed in a plurality of metal layers, each of the metal layers may be understood as a unit metal layer.

The first MIM capacitor and the second MIM capacitor may be formed in the same metal layer. In such a case, it may be understood that the first MIM capacitor and the second MIM capacitor are formed with reference to the MIM capacitor C31 and the MIM capacitor C32 formed in the metal layer ML3. In this case, the MIM capacitor C31 and the MIM capacitor C32 may be formed to have the same maximum charging voltage and the same charging capacity per unit area.

Furthermore, the first MIM capacitor and the second MIM capacitor may be formed in different metal layers. In such a case, it may be understood that the first MIM capacitor and the second MIM capacitor are formed with reference to the MIM capacitor C31 formed in the metal layer ML3 and the MIM capacitor C20 formed in the metal layer ML2 in FIG. 2. In this case, the MIM capacitor C31 and the MIM capacitor C20 may be formed to have different maximum charging voltages and different charging capacities per unit area.

The configuration is more specifically described with reference to FIG. 3.

Figure 3:
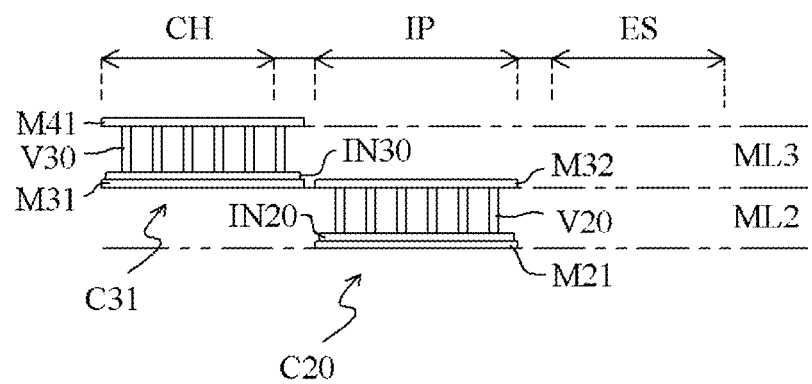
FIG. 3 is a cross-sectional view illustrating an example in which MIM capacitors corresponding to a data processing circuit and a channel circuit are configured.

In FIG. 3, the MIM capacitor C31 is configured to include a metal line M31, an insulating layer IN30, and a via contact V30, which are formed in the metal layer ML3, and a metal line M41 in the metal layer ML3. The MIM capacitor C20 is configured to include a metal line M21, an insulating layer IN20, and a via contact V20, which are formed in the metal layer ML2, and a metal line M32 in the metal layer ML3. It may be understood that FIG. 3 illustrates that the MIM capacitor C31 and the MIM capacitor C20 are formed in different metal layers.

One of the first MIM capacitor and the second MIM capacitor may be formed in a layer including unit layers of two or more layers, and the other thereof may be formed in the same layer as one or more unit layers of two or more layers. In such a case, the first MIM capacitor and the second MIM capacitor may be understood as the first MIM capacitor by the MIM capacitor C31 of the metal layer ML3, and the second MIM capacitor by the MIM capacitor C20 of the metal layer ML2 and the MIM capacitor C32 of the metal layer ML3 in FIG. 2, respectively.

Furthermore, the first MIM capacitor and the second MIM capacitor configured as described above may be coupled to each other in series or in parallel. That is, the first MIM capacitor and the second MIM capacitor may provide capacitance for the channel circuit 20 or the data processing circuit 30 while sharing some capacities.

Figure 4:
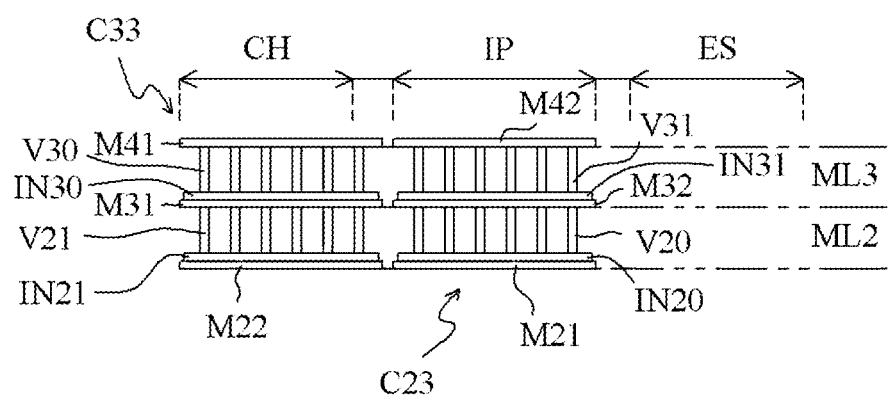
FIG. 4 is a cross-sectional view illustrating another example in which MIM capacitors corresponding to a data processing circuit and a channel circuit are configured.

It may be understood with reference to FIG. 4 that each of the first MIM capacitor and the second MIM capacitor is configured in plural layers. In FIG. 4, a redundant description of the same element as that in FIG. 3 is omitted.

In an embodiment of FIG. 4, a MIM capacitor of one layer is further configured under the metal line M31 of the first region CH, that is, in the metal layer ML2, and an MIM capacitor of one layer is further configured on the metal line M32 of the second region IP, that is, in the metal layer ML3, compared to FIG. 3.

That is, an MIM capacitor C33 further includes a metal line M22, an insulating layer IN21, and a via contact V21, which are configured in the metal layer ML2, compared to the MIM capacitor C31 of FIG. 3.

Furthermore, an MIM capacitor C23 further includes a metal line M42, an insulating layer IN31, and a via contact V31, which are configured in the metal layer ML3, compared to the MIM capacitor C20 of FIG. 3.

FIG. 4 illustrates an example in which each of the first MIM capacitor of the first region CH and the second MIM capacitor of the second region IP is configured in plural layers. The embodiment of FIG. 4 includes a unit capacitor for each layer, and has a structure in which the MIM capacitors are coupled in series for each region.

Furthermore, the first MIM capacitor and the second MIM capacitor may be configured to be coupled in series, in parallel, or in series and in parallel. For example, in FIG. 2, all of the MIM capacitor C31 and the two MIM capacitors C32 and C20 may be coupled in series, the two MIM capacitors C32 and C20 coupled in series to the MIM capacitor C31 may be coupled in parallel, and the two MIM capacitors C32 and C20 may be coupled in parallel to the MIM capacitor C31.

In addition to the examples, the first MIM capacitor and the second MIM capacitor may be configured to have various electrical connections depending on a manufacturer's intention.

The driving integrated circuit 10 for a display according to the present disclosure is configured to provide capacitance for the channel circuit 20 and the data processing circuit 30 by using the same kind of MIM capacitors overlapped in each of the regions in which the channel circuit 20 and the data processing circuit 30 are formed as described above.

Therefore, the channel circuit 20 and the data processing circuit 30 can secure capacitance, which is necessary for the driving of a signal or the output of a source signal, by using an upper MIM capacitor. As a result, the driving integrated circuit can reduce an area burden attributable to a capacitor.

Furthermore, the MIM capacitor can implement a high capacity with a smaller area than a capacitor using a MOS transistor.

Accordingly, the driving integrated circuit has advantages in that it can limit an increase in the chip size attributable to a capacitor and have a reduced chip size.

While various embodiments have been described above, it will be understood to those skilled in the art that the embodiments described are by way of example only. Accordingly, the disclosure described herein should not be limited based on the described embodiments.

What is claimed is:

1. A driving integrated circuit for a display:
a first circuit formed in a substrate on a chip, and within a first region;
a second circuit formed in the substrate on the chip, and within a second region;
a first MIM capacitor formed in a first layer over the substrate and having a first capacity for the first circuit; and
a second MIM capacitor formed in a second layer over the substrate and having a second capacity for the second circuit,
wherein the first capacity is formed to be greater than the second capacity, and
wherein the first MIM capacitor is formed within the first region, and the second MIM capacitor is formed within the second region.

2. The driving integrated circuit of claim 1, wherein the first layer in which the first MIM capacitor is formed and the second layer in which the second MIM capacitor is formed are different layers.

3. The driving integrated circuit of claim 1, wherein:
the first MIM capacitor is formed in the first layer comprising at least two first unit layers, and
the second MIM capacitor is formed in the second layer, which comprises one or more layers that are identical with one or more of the first unit layers.

4. The driving integrated circuit of claim 1, wherein:
the second MIM capacitor is formed in the second layer comprising at least two second unit layers, and
the first MIM capacitor is formed in the first layer, which comprises one or more layers that are identical with one or more of the second unit layers.

5. The driving integrated circuit of claim 1, wherein:
at least one of the first MIM capacitor and the second MIM capacitor comprises two or more unit MIM capacitors, and
the first MIM capacitor and the second MIM capacitor are coupled in series, in parallel, or in series and in parallel.

6. The driving integrated circuit of claim 5, wherein the two or more unit MIM capacitors are formed in an identical layer.

7. The driving integrated circuit of claim 5, wherein the two or more unit MIM capacitors are formed in different layers.

8. The driving integrated circuit of claim 1, wherein the first layer and the second layer are formed at locations isolated from the substrate with at least one metal layer interposed between the first layer and the second layer and the substrate.

9. The driving integrated circuit of claim 1, wherein:
the first circuit comprises a channel circuit configured to drive a first signal with a first voltage scale,
the second circuit comprises a data processing circuit configured to drive a second signal with a second voltage scale, and
the second voltage scale is smaller than the first voltage scale.

10. The driving integrated circuit of claim 9, wherein:
the first voltage scale has a maximum value set to become a driving voltage having a preset level, and
the second voltage scale has a maximum value set to become a half driving voltage which is an intermediate voltage of the driving voltage and a ground voltage.

11. The driving integrated circuit of claim 1, further comprising a third circuit formed in a third region of the substrate on the chip,
wherein the third circuit comprises a MOS capacitor for preventing electrostatic discharge (ESD).

12. A driving integrated circuit for a display, comprising:
a channel circuit formed in a substrate on a chip, and within a first region, and configured to drive a first signal with a first voltage scale;
a data processing circuit formed in a second region of the substrate on the chip, and within a second region, and configured to drive a second signal with a second voltage scale;
a first MIM capacitor formed in a first layer over the substrate within the first region and having a first capacity for the channel circuit; and
a second MIM capacitor formed in a second layer over the substrate within the second region and having a second capacity for the data processing circuit,
wherein the second voltage scale is smaller than the first voltage scale, and the first capacity is formed to be greater than the second capacity.

13. The driving integrated circuit of claim 12, wherein:
the first voltage scale has a maximum value set to become a driving voltage having a preset level,
the second voltage scale has a maximum value set to become a half driving voltage which is an intermediate voltage of the driving voltage and a ground voltage,
the first MIM capacitor is formed within the first region, and
the second MIM capacitor is formed within the second region.

14. The driving integrated circuit of claim 12, wherein at least one of the first MIM capacitor and the second MIM capacitor comprises a plurality of unit MIM capacitors having different capacities.

* * * * *